(12) United States Patent
Kim

(10) Patent No.: US 6,682,987 B2
(45) Date of Patent: Jan. 27, 2004

(54) METHODS OF FORMING A TRENCH ISOLATION REGION IN A SUBSTRATE BY REMOVING A PORTION OF A LINER LAYER AT A BOUNDARY BETWEEN A TRENCH ETCHING MASK AND AN OXIDE LAYER IN A TRENCH AND INTEGRATED CIRCUIT DEVICES FORMED THEREBY

(75) Inventor: Min-Chul Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 10/080,247

(22) Filed: Feb. 21, 2002

(65) Prior Publication Data

US 2002/0167067 A1 Nov. 14, 2002

(30) Foreign Application Priority Data

May 8, 2001 (KR) ......................................... 2001-24884

(51) Int. Cl.[7] ............................................... H01L 21/76
(52) U.S. Cl. ........................................ 438/435; 438/445
(58) Field of Search ................................ 438/221, 296, 438/359, 400, 435, 443, 445

(56) References Cited

U.S. PATENT DOCUMENTS

| 6,258,692 B1 | * | 7/2001 | Chu et al. .................... 438/400 |
| 6,391,784 B1 | * | 5/2002 | Ibok ............................. 438/702 |
| 2002/0014677 A1 | * | 2/2002 | Han et al. .................... 257/510 |

* cited by examiner

Primary Examiner—Amir Zarabian
Assistant Examiner—Pamela E. Perkins
(74) Attorney, Agent, or Firm—Myers Bigel Sibley & Sajovec, P.A.

(57) ABSTRACT

A trench isolation region is formed in a substrate by forming a trench-etching mask on the substrate. A trench is formed by etching the substrate through the trench-etching mask. An oxide layer is formed on sidewall and bottom surfaces of the trench. A liner layer is formed on the trench-etching mask and on the oxide layer. The liner layer is then removed at a boundary between the trench etching mask and the oxide layer so as to separate the liner layer into a first liner layer disposed on the trench etching mask and a second liner layer disposed on the oxide layer.

16 Claims, 3 Drawing Sheets

METHODS OF FORMING A TRENCH ISOLATION REGION IN A SUBSTRATE BY REMOVING A PORTION OF A LINER LAYER AT A BOUNDARY BETWEEN A TRENCH ETCHING MASK AND AN OXIDE LAYER IN A TRENCH AND INTEGRATED CIRCUIT DEVICES FORMED THEREBY

RELATED APPLICATION

This application claims the benefit of Korean Patent Application No. 2001-24884, filed May 8, 2001, the disclosure of which is hereby incorporated herein by reference.

FIELD OF THE INVENTION

The present invention relates generally to methods of forming integrated circuit devices and integrated circuit devices formed thereby and, more particularly, to trench isolation methods and integrated circuit devices formed thereby.

BACKGROUND OF THE INVENTION

As the integration density of semiconductor devices increases, distances between devices may decrease. Accordingly, trench isolation methods may be used to isolate fine sized devices that may not be possible to isolate by conventional local oxidation of silicon (LOCOS) isolation methods. In general, trench isolation methods isolate devices by forming a trench in a semiconductor substrate and filling the trench with an insulating material, such as silicon oxide.

Unfortunately, some trench isolation methods may result in stress being concentrated on the lower part or upper corners of the trench. In addition, heat treatment and oxidization processes for densifying the material burying the trench may impose stress on a silicon substrate. Such stress may cause silicon lattice defects, such as dislocation of a silicon lattice or stacking faults, and may degrade the characteristics of semiconductor devices formed on the silicon substrate.

A conventional method for reducing the effects of stress on a silicon substrate involves forming a thin liner layer of silicon nitride in a trench before filling the trench with an insulating material. This method will be described in more detail with reference to FIGS. 1–3. As illustrated in FIG. 1, a pad oxide layer 12 and a nitride layer 14 are sequentially formed on a silicon substrate 10 and are patterned to form a mask used to etch a trench. Next, the silicon substrate 10 is etched through the mask to form a trench at a predetermined depth. An oxide layer 16 is thinly formed to cover the inner wall of the trench. A liner layer 20 comprising silicon nitride is thinly formed on the surface of the silicon substrate 10, and a silicon oxide layer 30 is deposited on the surface of the silicon substrate 10 so as to fill the trench.

Referring now to FIG. 2, if a planarization process is performed to remove the silicon oxide layer 30 and nitride layer 14 on the pad oxide layer 12 and form the silicon oxide layer 32, then the liner layer 20 may also be etched to form the liner layer 22. As shown in FIG. 2, the liner layer 22 may be over etched to a predetermined depth that is slightly below the top surface of the silicon substrate 10.

Referring now to FIG. 3, if the pad oxide layer 12 is etched, then the oxide layer 16 and the oxide layer 32 may also be etched to form oxide layers 17 and 32, which remain adjacent to the liner layer 22. Unfortunately, in region A, a dent or a groove may be generated below the surface of the silicon substrate 10. Once a dent or a groove is generated, the depth and width of the dent or groove may increase due to subsequent ion insertion and/or cleaning process. The dent or groove may cause electrical defects, such as a hump phenomenon, decrease threshold voltage levels, and/or cause a bridge to form between gate electrodes in a semiconductor device, such as a transistor to be subsequently formed.

SUMMARY OF THE INVENTION

According to embodiments of the present invention, a trench isolation region is formed in a substrate by forming a trench-etching mask on the substrate. A trench is formed by etching the substrate through the trench-etching mask. An oxide layer is formed on sidewall and bottom surfaces of the trench. A liner layer is formed on the trench-etching mask and on the oxide layer. The liner layer is then removed at a boundary between the trench etching mask and the oxide layer so as to separate the liner layer into a first liner layer disposed on the trench etching mask and a second liner layer disposed on the oxide layer.

In other embodiments of the present invention, the liner layer is also removed at an upper surface of the trench-etching mask, opposite the substrate, and at the bottom surface of the trench.

In still other embodiments of the present invention, the liner layer comprises silicon nitride and is removed by dry etching the liner layer using an etching gas comprising at least one of $Ar/CH_3$ and $Ar/CF_4/O_2$. The liner layer may be formed using low-pressure chemical vapor deposition to a thickness of about 40–200 Å.

In still other embodiments of the present invention, the trench-etching mask is formed by forming a pad oxide layer on the substrate and forming a silicon nitride layer on the pad oxide layer. The pad oxide layer may be formed using thermal oxidation to a thickness of about 100–200 Å. The silicon nitride layer may be formed using low-pressure chemical vapor deposition to a thickness of about 500–1000 Å.

In still other embodiments of the present invention, forming the trench isolation region further comprises forming a trench isolation layer on the first and second liner layers and on the trench etching mask to bury the trench. The trench isolation layer is removed from an upper surface of the trench-etching mask, opposite the substrate, and from the second liner layer. The second liner layer and the trench-etching mask are then removed to expose the substrate.

In still other embodiments of the present invention, the trench isolation layer comprises high density plasma oxide and may be formed using plasma enhanced chemical vapor deposition to a thickness of about 5000–6000 Å.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
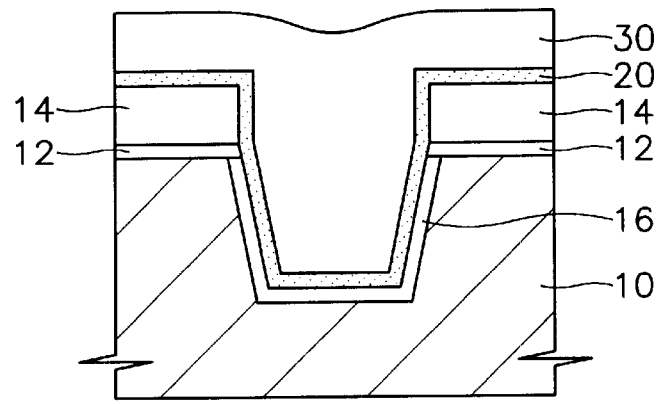
FIGS. 1–3 are cross sectional views that illustrate conventional trench isolation methods.
Figure 2:
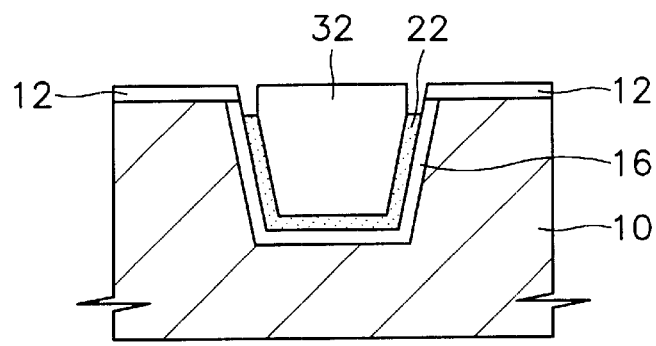
Figure 3:
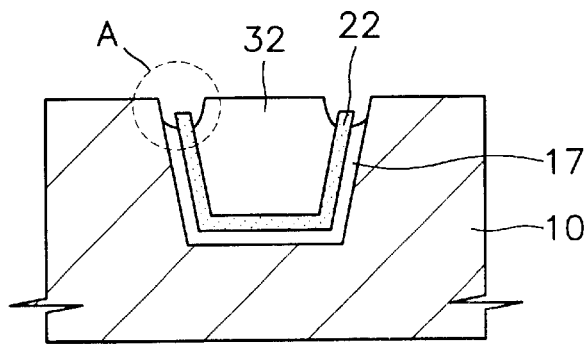

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 4:
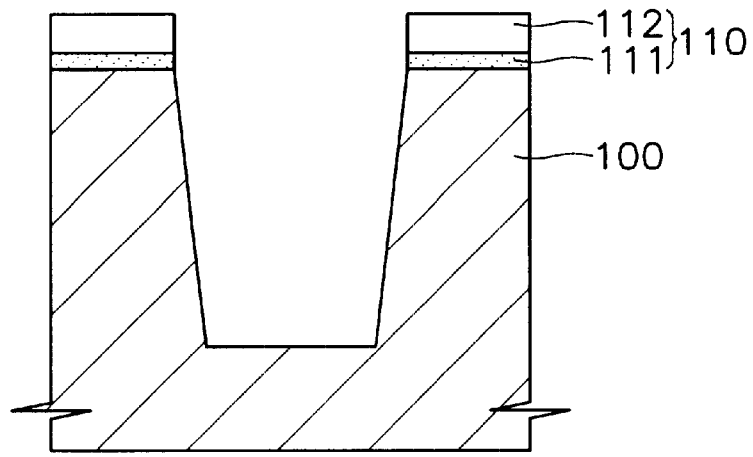
FIGS. 4–7 are cross sectional views that illustrate trench isolation methods and integrated circuit device structures formed thereby in accordance with embodiments of the present invention.

FIGS. 4–7 are cross sectional views that illustrate trench isolation methods and integrated circuit devices formed thereby in accordance with embodiments of the present invention. Referring now to FIG. 4, a trench etching mask 110, which comprises a pad oxide layer 111 and a silicon nitride layer 112, is formed on a semiconductor substrate 100, such as a silicon substrate. The pad oxide layer 111 may be formed using thermal oxidization to a thickness of about 100–200 Å in accordance with embodiments of the present invention. The silicon nitride layer 112 may be formed on the pad oxide layer 111 using low-pressure chemical vapor deposition (LPCVD) to a thickness of about 500–1000 Å.

A photoresist layer is then formed on the silicon nitride layer 112. The photoresist layer is exposed and developed using conventional photolithography processes to form a photoresist layer pattern (not shown) that exposes a portion of the surface of the silicon nitride layer 112 on a device isolation region of the semiconductor substrate 100. The exposed portion of the silicon nitride layer 112 and the pad oxide layer 111 underneath are removed using the photoresist layer pattern as an etching mask. The remaining portions of the silicon nitride layer 112 and the pad oxide layer 111 form the trench etching mask 110 that exposes the device isolation region of the semiconductor substrate 100. After the trench-etching mask 110 is formed, the photoresist layer pattern is removed. Portions of the semiconductor substrate 100 exposed by the trench etching mask 110 (i.e., the device isolation region) are etched through the trench etching mask 110. In accordance with embodiments of the present invention, the etching process is performed using dry etching to form a trench having a depth of about 0.25–0.35 $\mu$m.

Figure 5:
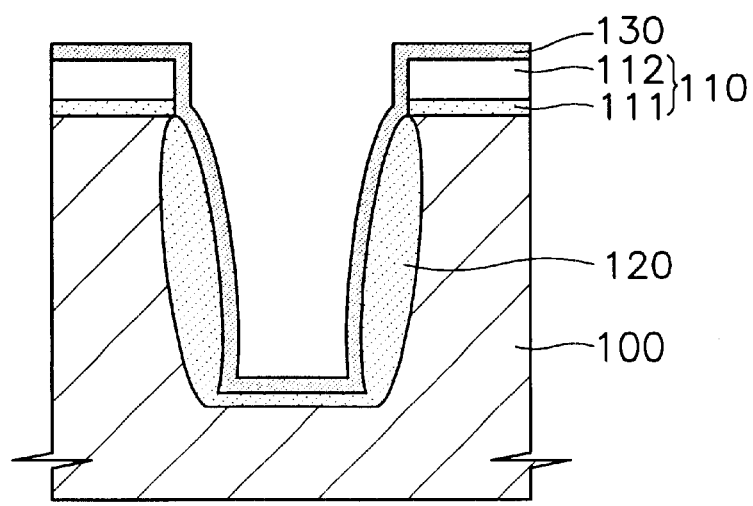

Referring now to FIG. 5, an oxide layer 120 is formed on sidewall and bottom surfaces of the trench. The oxide layer 120 may reduce lattice defects and other damage to the semiconductor substrate 100 that may be caused during the etching process for forming the trench. In accordance with embodiments of the present invention, the oxide layer 120 is formed using thermal oxidization to a thickness of about 50–300 Å. A liner layer 130 is then deposited on the surface of the trench etching mask 110 and the oxide layer 120 as shown in FIG. 5. The liner layer 130 may reduce stress that may affect the semiconductor substrate 100 and may comprise silicon nitride. In accordance with embodiments of the present invention, the liner layer 130 may be formed using low pressure chemical vapor deposition (LPCVD) to a thickness of about 40–200 Å.

Figure 6:
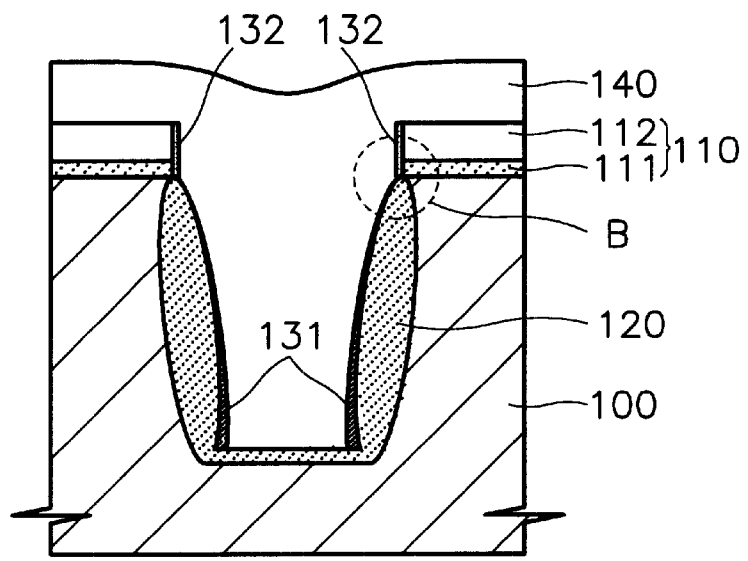

Referring now to FIG. 6, portions of the silicon nitride liner layer 130 of FIG. 5 at and adjacent to the boundary (region B) between the trench etching mask 110 and the oxide layer 120 are removed by dry etching the liner layer 130 using a mixed gas comprising at least one of $Ar/CHF_3$ and $Ar/CF_4/O_2$. After completing the dry etching process, the top surface of the trench etching mask 110 and the surface of the oxide layer 120 at the bottom of the trench are exposed, and a first silicon nitride liner layer 131 and a second silicon nitride liner layer 132 are left on the sidewalls of the oxide layer 120 and on the sidewalls of the trench etching mask 110, respectively. In accordance with embodiments of the present invention, the first and second silicon nitride liner layers 131 and 132 are isolated from each other at the boundary B between the trench etching mask 110 and the oxide layer 120. The thickness of the trench-etching mask 110 after the dry etching process is complete may be at least about 400 Å in accordance with embodiments of the present invention.

After the dry etching process is complete, the resulting structure may be cleaned to remove condensation that may be introduced by the etching process. A trench isolation layer 140 is then deposited on the surface of the semiconductor substrate 100 to thereby bury the trench as shown in FIG. 6. The trench isolation layer 140 comprises high-density plasma oxide, which has generally good filling characteristics, in accordance with embodiments of the present invention. The trench isolation layer 140 is formed using plasma enhanced chemical vapor deposition (PECVD) to a thickness of about 5000–6000 Å in accordance with embodiments of the present invention. An annealing process is then performed on the trench isolation layer 140 at a temperature of about 1050° C. for about 1 hour to reduce the susceptibility of the trench isolation layer 140 from being excessively recessed in a subsequent planarization process.

Figure 7:
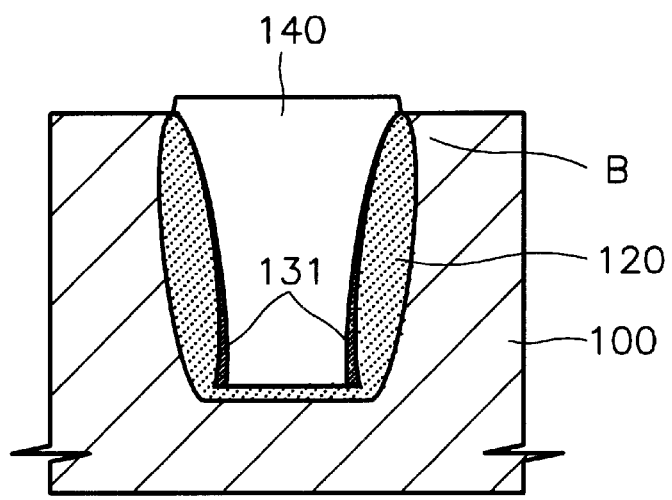

Referring now to FIG. 7, the trench isolation layer 140 on the trench etching mask 110 is removed using the second silicon nitride liner layer 132 and the silicon nitride layer 112 as an etch stop layer. The silicon nitride layer 112 and the second silicon nitride liner layer 132 are then removed by wet etching. Even though the silicon nitride layer 112 and the second silicon nitride liner layer 132 are removed, because the first and second silicon nitride liner layers 131 and 132 are isolated from each other, the first silicon nitride liner layer 131 is not etched during the removal of the second silicon nitride liner layer. Therefore, a dent or a groove is not generated during the removal of the second silicon nitride liner layer 132. After the silicon nitride layer 112 and the second silicon nitride liner layer 132 are removed, the pad oxide layer 111 is removed by wet etching. As shown in FIG. 7, a trench isolation region may be formed having a reduction in any groove or dent in a surface of the substrate.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method of forming a trench isolation region in a substrate, comprising:

forming a trench-etching mask on the substrate;

forming a trench by etching the substrate through the trench-etching mask;

forming an oxide layer on sidewall and bottom surfaces of the trench;

forming a liner layer on the trench etching mask and on the oxide layer; and removing the liner layer at a boundary between the trench etching mask and the oxide layer so as to separate the liner layer into a first liner layer disposed on the trench etching mask and a second liner layer disposed on the oxide layer.

2. The method of claim 1, wherein removing the liner layer comprises:

removing the liner layer at the boundary between the trench etching mask and the oxide layer, at an upper surface of the trench etching mask, opposite the substrate, and at the bottom surface of the trench so as to separate the liner layer into the first liner layer disposed on a sidewall surface of the trench etching mask and the second liner layer disposed on the oxide layer.

3. The method of claim 1, wherein removing the liner layer comprises dry etching the liner layer.

4. The method of claim 3, wherein the dry etching is performed using an etching gas comprising at least one of $Ar/CH_3$ and $Ar/CF_4/O_2$.

5. The method of claim 3, further comprising:

cleaning a resulting structure after dry etching the liner layer.

6. The method of claim 1, wherein the liner layer comprises silicon nitride.

7. The method of claim 1, wherein forming the liner layer comprises:

forming the liner layer using low-pressure chemical vapor deposition to a thickness of about 40–200.

8. The method of claim 1, wherein forming the trench-etching mask comprises:

forming a pad oxide layer on the substrate;

forming a silicon nitride layer on the pad oxide layer.

9. The method of claim 8, wherein forming the pad oxide layer comprises:

forming the pad oxide layer using thermal oxidation to a thickness of about 100–200.

10. The method of claim 8, wherein forming the silicon nitride layer comprises:

forming the silicon nitride layer using low-pressure chemical vapor deposition to a thickness of about 500–1000.

11. The method of claim 1, wherein forming the oxide layer comprises: forming the oxide layer using thermal oxidation to a thickness of about 50–300.

12. The method of claim 1, further comprising:

forming a trench isolation layer on the first and second liner layers and on the trench-etching mask to bury the trench;

removing the trench isolation layer from an upper surface of the trench etching mask, opposite the substrate, and from the second liner layer; and removing the second liner layer and the trench-etching mask to expose the substrate.

13. The method of claim 12, wherein removing the trench isolation layer comprises:

etching the trench isolation layer using the upper surface of trench etching mask and the second liner layer as an etch stop layer.

14. The method of claim 12, wherein the trench isolation layer comprises high-density plasma oxide.

15. The method of claim 12, wherein forming the trench isolation layer comprises:

forming a high density plasma oxide layer using plasma enhanced chemical vapor deposition to a thickness of about 5000–6000.

16. The method of claim 12, further comprising:

annealing the trench isolation layer at a temperature of about 1050° C. for about one hour.

* * * * *

UNITED STATES PATENT AND TRADEMARK OFFICE
CERTIFICATE OF CORRECTION

PATENT NO. : 6,682,987 B2
DATED : January 27, 2004
INVENTOR(S) : Kim

It is certified that error appears in the above-identified patent and that said Letters Patent is hereby corrected as shown below:

Title page,
Item [56] References Cited, should include the following:
FOREIGN PATENT DOCUMENTS
-- KR   2000-0020911  4/2000 --
OTHER PUBLICATIONS,
-- Notice to Submit Response, Korean Application No. 10-2001-0024884, February 25, 2003.--

Signed and Sealed this

Seventh Day of September, 2004

JON W. DUDAS
*Director of the United States Patent and Trademark Office*